(12) United States Patent
Chung et al.

(10) Patent No.: US 12,087,732 B2
(45) Date of Patent: *Sep. 10, 2024

(54) ISOLATION BONDING FILM FOR SEMICONDUCTOR PACKAGES AND METHODS OF FORMING THE SAME

(71) Applicant: Taiwan Semiconductor Manufacturing Co., Ltd., Hsinchu (TW)

(72) Inventors: Ming-Tsu Chung, Hsinchu (TW); Ku-Feng Yang, Baoshan Township (TW); Yung-Chi Lin, Su-Lin (TW); Wen-Chih Chiou, Zhunan Township (TW); Chen-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/338,013

(22) Filed: Jun. 20, 2023

(65) Prior Publication Data

US 2023/0343747 A1    Oct. 26, 2023

Related U.S. Application Data

(60) Continuation of application No. 17/408,662, filed on Aug. 23, 2021, now Pat. No. 11,721,666, which is a
(Continued)

(51) Int. Cl.
*H01L 25/065* (2023.01)
*H01L 21/683* (2006.01)
(Continued)

(52) U.S. Cl.
CPC ...... *H01L 25/0652* (2013.01); *H01L 21/6836* (2013.01); *H01L 21/82* (2013.01);
(Continued)

(58) Field of Classification Search
CPC . H01L 2225/06582; H01L 2224/05647; H01L 2224/08225; H01L 2224/09181; H01L 2224/80203; H01L 2224/80357; H01L 2224/80948; H01L 2224/80986; H01L 2224/9202; H01L 2224/94; H01L 2224/95; H01L 2225/06513;
(Continued)

(56) References Cited

U.S. PATENT DOCUMENTS

8,993,380 B2   3/2015   Hou et al.
9,281,254 B2   3/2016   Yu et al.
(Continued)

*Primary Examiner* — Caleen O Sullivan
(74) *Attorney, Agent, or Firm* — Slater Matsil, LLP (57) ABSTRACT

A semiconductor package including an improved isolation bonding film and methods of forming the same are disclosed. In an embodiment, a semiconductor device includes a first die bonded to a package substrate, the first die including vias extending through a substrate, the vias extending above a top surface of the substrate; a first dielectric film extending along a top surface of the package substrate, along the top surface of the substrate, and along sidewalls of the first die, the vias extending through the first dielectric film; a second die bonded to the first dielectric film and the vias; and an encapsulant over the package substrate, the first die, the first dielectric film, and the second die.

20 Claims, 11 Drawing Sheets

Related U.S. Application Data division of application No. 16/456,678, filed on Jun. 28, 2019, now Pat. No. 11,101,240.

(51) Int. Cl.
- *H01L 21/82* (2006.01)
- *H01L 23/00* (2006.01)
- *H01L 23/48* (2006.01)
- *H01L 25/00* (2006.01)

(52) U.S. Cl.
CPC ............ *H01L 23/481* (2013.01); *H01L 24/08* (2013.01); *H01L 24/80* (2013.01); *H01L 25/50* (2013.01); *H01L 2221/68327* (2013.01); *H01L 2224/08146* (2013.01); *H01L 2224/80895* (2013.01); *H01L 2224/80896* (2013.01); *H01L 2225/06524* (2013.01); *H01L 2225/06541* (2013.01); *H01L 2225/06568* (2013.01); *H01L 2225/06582* (2013.01)

(58) Field of Classification Search
CPC ....... H01L 2225/06517; H01L 25/0657; H01L 25/105; H01L 21/76897; H01L 25/0652; H01L 21/6836; H01L 21/82; H01L 23/481; H01L 24/08; H01L 24/80; H01L 25/50; H01L 2221/68327; H01L 2224/08146; H01L 2224/80895; H01L 2224/80896; H01L 2225/06524; H01L 2225/06541; H01L 2225/06568; H01L 2224/80001
USPC ....................................................... 257/621
See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 11,101,240 | B2 | 8/2021 | Chung et al. |
| 2006/0223232 | A1 | 10/2006 | Egawa |
| 2007/0158807 | A1 | 7/2007 | Lu et al. |
| 2011/0147911 | A1 | 6/2011 | Kohl et al. |
| 2014/0084456 | A1 | 3/2014 | Kang et al. |
| 2017/0125376 | A1 | 5/2017 | Yeh et al. |
| 2020/0006164 | A1 | 1/2020 | Yu et al. |
| 2020/0118908 | A1 | 4/2020 | Yu et al. |
| 2020/0135605 | A1 | 4/2020 | Yu et al. |

ISOLATION BONDING FILM FOR SEMICONDUCTOR PACKAGES AND METHODS OF FORMING THE SAME

PRIORITY CLAIM AND CROSS-REFERENCE

This application is a continuation of U.S. patent application Ser. No. 17/408,662, filed on Aug. 23, 2021, now U.S. Pat. No. 11,721,666, issued Aug. 8, 2023, and entitled "Isolation Bonding Film for Semiconductor Packages and Methods of Forming the Same," which is a divisional of U.S. patent application Ser. No. 16/456,678, filed on Jun. 28, 2019, now U.S. Pat. No. 11,101,240, issued Aug. 24, 2021, and entitled "Isolation Bonding Film for Semiconductor Packages and Methods of Forming the Same," each application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved methods for forming integrated circuit devices (e.g., Chip-on-Wafer (CoW) devices) and integrated circuit devices formed by said methods. The methods include thinning and singulating dies without the use of a carrier substrate. The dies are then bonded to a package substrate using a process such as hybrid bonding. Back surfaces of the dies are etched back, an isolation bonding film is formed over the dies and the package substrate, and the isolation bonding film is planarized to expose bonding pads of the dies. The isolation bonding film may be used to protect portions of the dies, such as substrates of the dies, from the diffusion of material, such as copper, from additional dies subsequently bonded to the dies. Additional dies may then be bonded to the dies using the same processes and additional isolation bonding films may be formed over the additional dies. The inclusion of the isolation bonding films improves device performance and reduces device defects.

Figure 1:
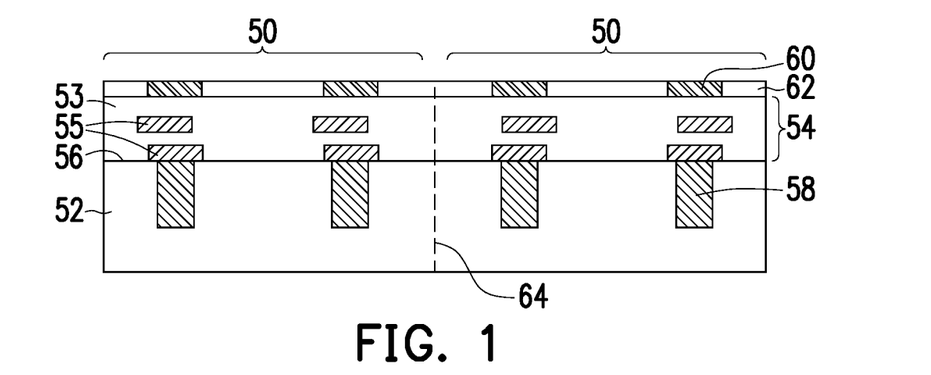
FIG. 1 illustrates a cross-sectional view of a wafer including first dies, in accordance with some embodiments.

FIG. 1 illustrates a cross-sectional view of integrated circuit devices 50 (hereinafter referred to as a first dies 50) prior to singulation, in accordance with some embodiments. Each of the first dies 50 may be a logic die (e.g., a central processing unit (CPU), a graphics processing unit (GPU), a system-on-a-chip (SoC), a microcontroller, or the like), a memory die (e.g., a dynamic random access memory (DRAM) die, a static random access memory (SRAM) die, or the like), a power management die (e.g., a power management integrated circuit (PMIC) die), a radio frequency (RF) die, a sensor die, a micro-electro-mechanical-system (MEMS) die, a signal processing die (e.g., a digital signal processing (DSP) die), a front-end die (e.g., an analog front-end (AFE) die), the like, or combinations thereof. As illustrated in FIG. 1, the first dies 50 may be formed in a wafer, which may include different device regions that are singulated in subsequent steps to form the plurality of first dies 50. The first dies 50 include a substrate 52 and an interconnect structure 54.

The substrate 52 may include a bulk semiconductor substrate, a semiconductor-on-insulator (SOI) substrate, a multi-layered semiconductor substrate, or the like. The semiconductor material of the substrate 52 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 52 may be doped or undoped. Devices, such as transistors, capacitors, resistors, diodes, and the like, may be formed in and/or on an active surface 56 (e.g., the surface facing upward) of the substrate 52.

Vias 58 may be formed extending from the active surface 56 into the substrate 52. The vias 58 may be formed by forming recesses in the substrate 52 by, for example, etching, milling, laser techniques, a combination thereof, and/or the like. A thin barrier layer may be conformally deposited over the front surface of the substrate 52 and in the openings, such as by CVD, atomic layer deposition (ALD), physical vapor deposition (PVD), thermal oxidation, combinations thereof, and/or the like. The barrier layer may be formed from a nitride or an oxynitride, such as titanium nitride, titanium oxynitride, tantalum nitride, tantalum oxynitride, tungsten nitride, combinations thereof, and/or the like. A conductive material may be deposited over the thin barrier layer and in the openings. The conductive material may be formed by an electro-chemical plating process, CVD, ALD, PVD, combinations thereof, and/or the like. Examples of conductive materials are copper, tungsten, aluminum, silver, gold, combinations thereof, and/or the like. As such, the vias 58 may include a conductive material, with a thin barrier layer between the conductive material and the substrate 52. Excess conductive material and barrier layer may be removed from the front surface of the substrate 52 by, for example, a chemical-mechanical polish (CMP). In some embodiments, the vias 58 may extend into the interconnect structure 54. The vias 58 may be used to provide electrical connections between the first dies 50 and other dies or semiconductor devices.

The interconnect structure 54 is formed on the active surface 56 of the substrate 52 and includes one or more dielectric layers 53 and one or more metallization patterns 55. The dielectric layers 53 may be inter-layer dielectric (ILD) layers and/or inter-metallization dielectric (IMD) layers. The dielectric layers 53 may be formed from, for example, silicon oxide, silicon nitride, silicon carbide, silicon oxynitride, a polymer, which may be a photo-sensitive material such as polybenzoxazole (PBO), polyimide, or benzocyclobutene (BCB), a low-K dielectric material such as undoped silicate glass (USG), phosphosilicate glass (PSG), borophosphosilicate glass (BPSG), fluorosilicate glass (FSG), SiOxCy, spin-on glass (SOG), spin-on polymers, silicon carbon material, compounds thereof, composites thereof, combinations thereof, or the like, by any suitable method known in the art, such as spin coating, chemical vapor deposition (CVD), plasma-enhanced CVD (PECVD), high-density plasma chemical vapor deposition (HDP-CVD), or the like. The metallization patterns 55 in the dielectric layers 53 may route electrical signals between the devices, such as by using vias and/or traces, and may also contain various electrical devices, such as capacitors, resistors, inductors, or the like. The various devices and metallization patterns 55 may be interconnected to perform one or more functions. The functions may include memory structures, processing structures, sensors, amplifiers, power distribution, input/output circuitry, or the like. Additionally, die connectors such as conductive pillars or contact pads, are formed in and/or on the interconnect structure 54 to provide an external electrical connection to the circuitry and devices. One of ordinary skill in the art will appreciate that the above examples are provided for illustrative purposes. Other circuitry may be used as appropriate for a given application.

FIG. 1 illustrates that the vias 58 extend only through the substrate 52. However, in some embodiments the vias 58 may extend through one or more of the dielectric layers 53 of the interconnect structure 54.

Bond pads 60 and a dielectric bonding layer 62 may be formed at a front surface (e.g., the surface facing upward) of the interconnect structure 54. The bond pads 60 may be formed of the same materials as the metallization patterns 55 and the dielectric bonding layer 62 may be formed of the same materials as the dielectric layers 53. In a specific embodiment, the bond pads 60 may be formed of a metal that easily diffuses and is suitable for hybrid bonding, such as copper, a copper alloy, or the like and the dielectric bonding layer 62 may be formed of a material suitable for hybrid bonding, such as silicon oxide or the like. As illustrated in FIG. 1, top surfaces of the bond pads 60 may be level with top surfaces of the dielectric bonding layer 62. One of ordinary skill in the art will appreciate that the above examples are provided for illustrative purposes. Other circuitry may be used as appropriate for a given application.

In some embodiments, the first dies 50 are stacked devices that include multiple substrates 52. For example, the first dies 50 may be memory devices such as hybrid memory cube (HMC) modules, high bandwidth memory (HBM) modules, or the like that include multiple memory dies. In such embodiments, the first dies 50 include multiple substrates 52 interconnected by vias. Each of the substrates 52 may (or may not) have a separate interconnect structure 54.

Figure 2A:
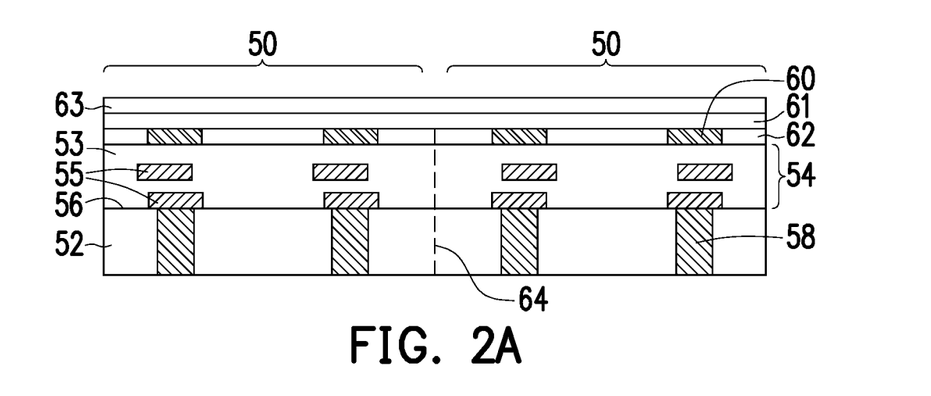
FIGS. 2A-2C illustrate cross-sectional views a thinning and singulation of the first dies, in accordance with some embodiments.
Figure 2B:
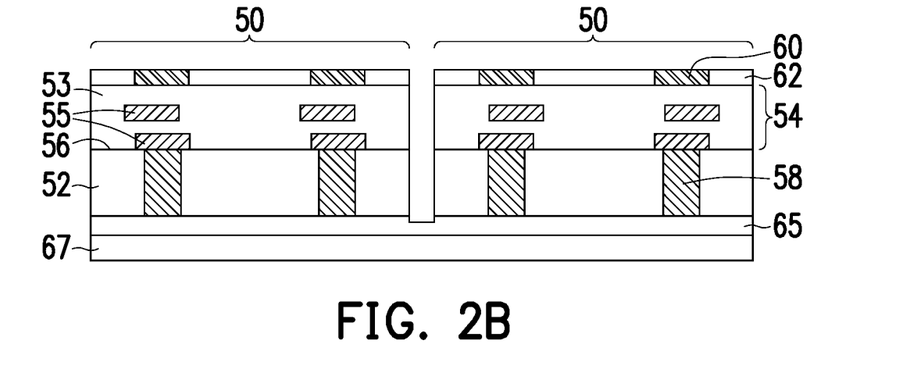
Figure 2C:
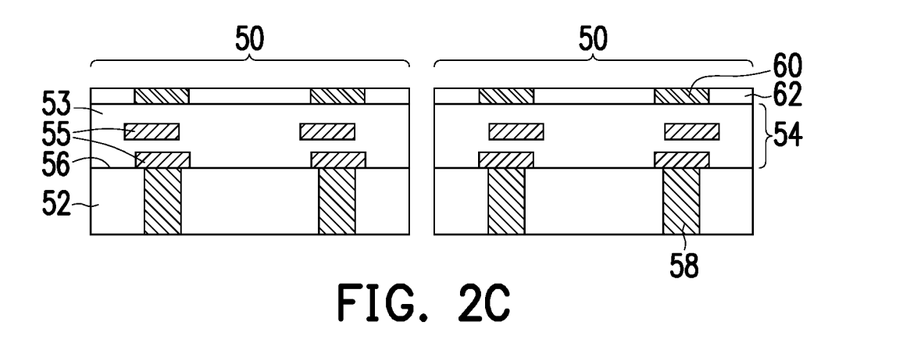

In FIGS. 2A-2C the vias 58 are exposed from the backside of the substrate 52 and the individual first dies 50 are singulated. Referring to FIG. 2A, a protective layer 61 is formed over the dielectric bonding layer 62 and the bond pads 60. In some embodiments, the protective layer 61 may comprise one or more layers of photo-patternable insulating materials such as polybenzoxazole (PBO), polyimide (PI), benzocyclobutene (BCB), a combination thereof, or the like, and may be formed using a spin-on coating process, or the like. The protective layer 61 may have a thickness from of less than about 1 µm. The protective layer 61 may be used to protect the dielectric bonding layer 62 and the bond pads 60 from contamination during back grinding process used to thin the substrate 52. In some embodiments, before forming the protective layer 61, each of the first dies 50 may be tested to identify known good dies (KGDs) for further processing.

FIG. 2A further illustrates the back grinding of the substrate 52 used to reduce the thickness of the substrate 52 and to expose the vias 58. A tape 63 such as a back grinding (BG) tape may be applied to a top surface of the protective layer 61, and the back side of the substrate 52 may be thinned by grinding, etching, a chemical mechanical polishing (CMP) process, a combination thereof, or the like. In some embodiments, the tape 63 further protects the dielectric bonding layer 62 and the bond pads 60 from contamination caused by grinding fluids and/or debris. In some embodiments, the substrate 52 may be thinned such that surfaces of the substrate 52 are level with surfaces of the vias 58. After the vias 58 are exposed, the vias 58 may be referred to as through vias, through-substrate vias or, in embodiments in which the substrate 52 is a silicon substrate, through-silicon vias (TSVs). In some embodiments, the substrate 52 may have a thickness of greater than about 40 µm following the back grinding. The tape 63 and the protective layer 61 may be removed following the back grinding process and surfaces of the dielectric bonding layer 62 and the bond pads 60 may be cleaned. In contrast to prior art methods of thinning a substrate which include a carrier substrate, using the tape 63 and the protective layer 61 protects the dielectric bonding layer 62 and the bond pads 60 from contamination, which can lead to weak bonding between the first dies 50 and a package substrate (e.g., package substrate 100 illustrated in FIGS. 3 and 4). As such, forming the first dies 50 without a carrier substrate reduces defects in completed devices. Moreover, thinning the substrate 52 without a carrier substrate may lower the cost of forming the first dies 50.

Referring to FIG. 2B, after the tape 63 and the protective layer 61 are removed, the first dies 50 may be singulated. In some embodiments, the substrate 52 may be attached to a frame 67 using an adhesive 65 to prepare the first dies 50 for a subsequent dicing process. In some embodiments, the frame 67 may be a film frame or any suitable carrier to provide mechanical support for subsequent operations, such as dicing. The adhesive 65 may be a die attach film, a dicing film, or any suitable adhesive, epoxy, ultraviolet (UV) glue (which loses its adhesive property when exposed to UV radiation), or the like, and may be formed using a deposition process, a spin coating, a printing process, a lamination process, or the like. In some embodiments, the adhesive 65 may have a multilayer structure and may comprise a release layer (not show). The release layer may help to safely remove individual first dies 50 from the frame 67 after the dicing process is completed. In some embodiments, the release layer may be a UV type, wherein adhesive strength of the release layer is substantially reduced after exposing the release layer to UV radiation. In other embodiments, the release layer may be a thermal type, wherein adhesive strength of the release layer is substantially reduced after exposing the release layer to a suitable heat source. In some embodiments, the first dies 50 may be singulated by sawing, laser ablation, a combination thereof, or the like. FIG. 2C illustrates the first dies 50 following singulation and after the adhesive 65 and the frame 67 have been removed.

Figure 3:
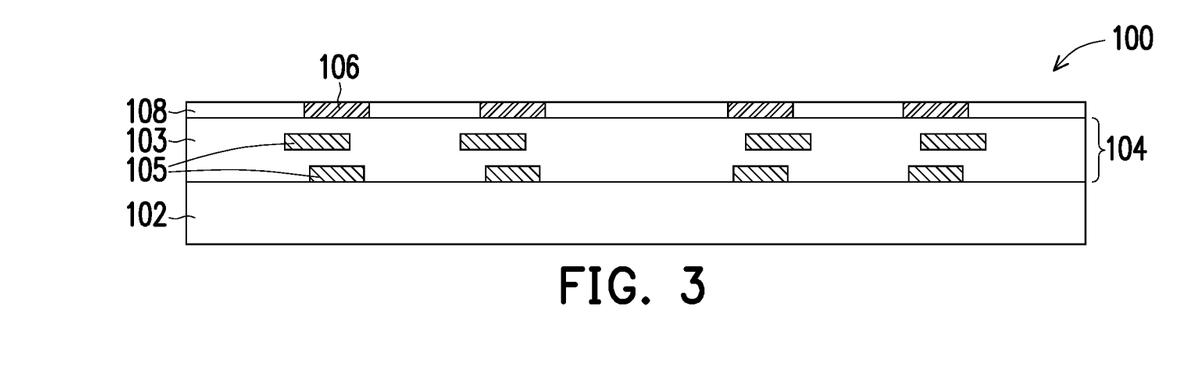
FIG. 3 illustrates a cross-sectional view of a package substrate, in accordance with some embodiments.

FIG. 3 illustrates a cross-sectional view of a package substrate 100, in accordance with some embodiments. As described in greater detail below with respect to FIG. 4, the package substrate 100 illustrates an example package substrate upon which the first dies 50, discussed above, will be subsequently attached. In some embodiments, the package substrate 100 may be a semiconductor wafer, which may be subsequently singulated. The package substrate 100 includes a substrate 102 and an interconnect structure 104. The substrate 102 may be a bulk semiconductor substrate, SOI substrate, multi-layered semiconductor substrate, or the like. The semiconductor material of the substrate 102 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 102 may be doped or undoped. Active devices such as transistors may (or may not) be in and/or on a front surface (e.g., the surface facing upward) of the substrate 102. Passive devices such as capacitors, resistors, diodes, or the like may (or may not) be in and/or on the front surface of the substrate 102.

The interconnect structure 104 is formed over the front surface of the substrate 102, and is used to electrically connect the devices of the substrate 102 (if any) together and/or to external devices. The interconnect structure 104 may further be used to electrically connect devices (e.g., the first dies 50) attached to the interconnect structure 104. The interconnect structure 104 may include one or more dielectric layers 103 and one or more metallization patterns 105 in the dielectric layers 103. The metallization patterns 105 may include vias and/or traces to interconnect any devices together and/or to an external device. The dielectric layers 103 may be formed from silicon oxide, silicon nitride, silicon carbide, silicon oxynitride, a polymer, which may be a photo-sensitive material such as PBO, polyimide, or BCB, a low-K dielectric material such as PSG, BPSG, FSG, SiOxCy, SOG, spin-on polymers, silicon carbon material, compounds thereof, composites thereof, combinations thereof, or the like. The dielectric layers 103 may be deposited by any suitable method, such as spin coating, CVD, PECVD, HDP-CVD, or the like. A metallization pattern 105 may be formed in the dielectric layer 103, for example, by using photolithography techniques to deposit and pattern a photoresist material on the dielectric layer 103 to expose portions of the dielectric layer 103 that are to become the metallization pattern 105. An etch process, such as an anisotropic dry etch process, may be used to create recesses and/or openings in the dielectric layer 103 corresponding to the exposed portions of the dielectric layer 103. The recesses and/or openings may be lined with a diffusion barrier layer and filled with a conductive material. The diffusion barrier layer may be formed from one or more layers of TaN, Ta, TiN, Ti, CoW, or the like, deposited by ALD or the like, and the conductive material may be formed from copper, aluminum, tungsten, silver, combinations thereof, or the like, and may be deposited by CVD, PVD, or the like. Any excessive diffusion barrier layer and/or conductive material on the dielectric layer 103 may be removed, such as by using a CMP.

Bond pads 106 and a dielectric bonding layer 108 may be formed at a front surface (e.g., the surface facing upward) of the interconnect structure 104. The bond pads 106 may be formed of the same materials as the metallization patterns 105 and the dielectric bonding layer 108 may be formed of the same materials as the dielectric layers 103. In a specific embodiment, the bond pads 106 may be formed of a metal that easily diffuses and is suitable for hybrid bonding, such as copper, a copper alloy, or the like and the dielectric bonding layer 108 may be formed of a material suitable for hybrid bonding, such as silicon oxide or the like. As illustrated in FIG. 3, top surfaces of the bond pads 106 may be level with top surfaces of the dielectric bonding layer 108. One of ordinary skill in the art will appreciate that the above examples are provided for illustrative purposes. Other circuitry may be used as appropriate for a given application.

Figure 4:
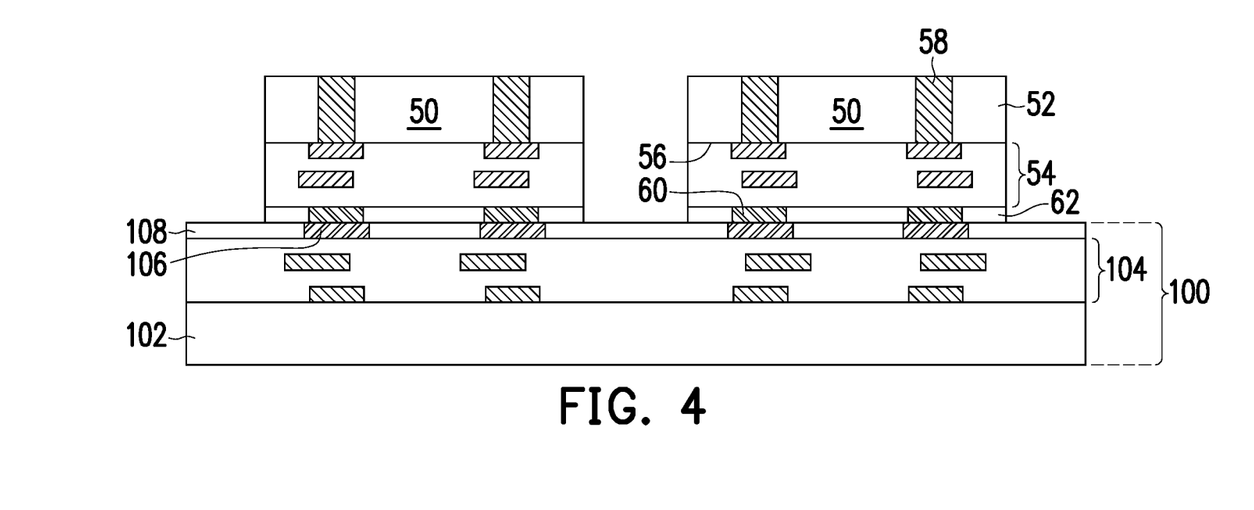
FIG. 4 illustrates a cross-sectional view of the first dies bonded to a front surface of the package substrate, in accordance with some embodiments.

FIG. 4 illustrates an embodiment in which two of the first dies 50 are bonded to the package substrate 100 through hybrid bonding in a face-to-face (F2F) configuration. To achieve the hybrid bonding, the first dies 50 are aligned with and placed on the package substrate 100 such that the dielectric bonding layers 62 on the active surfaces of the first dies 50 contact the dielectric bonding layer 108 on the front surface of the package substrate 100, and the bond pads 60 of the first dies 50 contact the bond pads 160 of the package substrate 100. In some embodiments, an annealing process is performed to cause inter-diffusion of the metals in the bond pads 60 of the first dies 50 and the bond pads 106 of the package substrate 100 and to strengthen the weak bonds between the first dies and the package substrate 100. The annealing temperature may be from about 100° C. to about 400° C., below about 250° C., or about 150° C. The annealing time may be from about 30 minutes to about 3 hours, such as about 3 hours. In accordance of some embodiments, a thermal compression bond (TCB) may be applied to locally heat up the bonding interfaces to reduce the bonding time and the thermo-mechanical stress at the bonding joints due to a mismatch of coefficient of thermal expansion (CTE) among the package substrate 100, the first dies 50, and the bonding tool. Although two first dies 50 are illustrated as being bonded to the package substrate 100, any number of first dies 50 may be bonded to the package substrate 100.

Through the hybrid bonding, the bond pads 60 and the bond pads 106 are bonded to each other with metal-to-metal direct bonding, and the dielectric bonding layers 62 of the first dies 50 are also bonded to the dielectric bonding layer 108 of the package substrate 100 with dielectric-to-dielectric bonding. The resulting bonds between the dielectric bonding layers 62 and the dielectric bonding layer 108 are dielectric-to-dielectric bonds, which may be inorganic-to-polymer, polymer-to-polymer, or inorganic-to-inorganic bonds in accordance with various embodiments. Furthermore, the dielectric bonding layers 62 of the first dies 50 and the dielectric bonding layer 108 of the package substrate 100 may be different from each other (for example, with one being a polymer layer and the other being an inorganic layer), and hence there may be two types of inorganic-to-polymer, polymer-to-polymer, and inorganic-to-inorganic bonds existing simultaneously in the same package.

Figure 5:
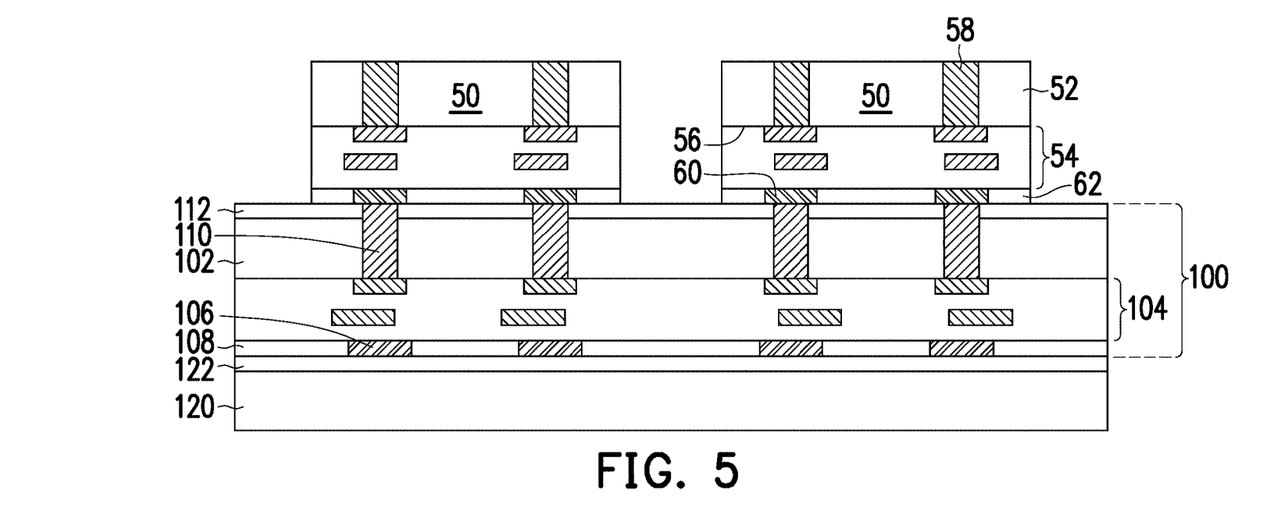
FIG. 5 illustrates a cross-sectional view of the first dies bonded to a back surface of the package substrate, in accordance with some embodiments.

FIG. 5 illustrates a cross-sectional view of an embodiment in which two of the first dies 50 are bonded to the package substrate 100 through hybrid bonding in a face-to-back (F2B) configuration. As discussed above, FIG. 4 illustrates a F2F embodiment in which front sides of the first dies 50 are bonded to a front side of the package substrate 100. In contrast, FIG. 5 illustrates a F2B embodiment in which front sides of the first dies 50 are attached to a backside of the package substrate 100, The first dies 50 may be placed on the package substrate 100 for bonding using a pick-and-place tool. The hybrid bonding of the first dies 50 to the package substrate 100 may be accomplished using the same methods discussed above with respect to FIG. 4. In this embodiment, the package substrate 100 may be attached to a carrier substrate 120 using a release layer 122 and the package substrate 100 may further include vias 110 and a backside dielectric layer 112.

As illustrated in FIG. 5, the bond pads 106 and the dielectric bonding layer 108 may be attached to the carrier substrate 120 using the release layer 122. The carrier substrate 120 may be a glass carrier substrate, a ceramic carrier substrate, or the like. The carrier substrate 120 may be a wafer, such that multiple packages can be formed on the carrier substrate 120 simultaneously. The release layer 122 may be formed of a polymer-based material, which may be removed along with the carrier substrate 120 from the overlying structures that will be formed in subsequent steps. In some embodiments, the release layer 122 is an epoxy-based thermal-release material, which loses its adhesive property when heated, such as a light-to-heat-conversion (LTHC) release coating. In other embodiments, the release layer 122 may be an ultra-violet (UV) glue, which loses its adhesive property when exposed to UV lights. The release layer 122 may be dispensed as a liquid and cured, may be a laminate film laminated onto the carrier substrate 120, or may be the like. The top surface of the release layer 122 may be leveled and may have a high degree of coplanarity.

The vias 110 may be formed by forming recesses in the substrate 102 by, for example, etching, milling, laser techniques, a combination thereof, and/or the like. A thin barrier layer may be conformally deposited over the front surface of the substrate 102 and in the openings, such as by CVD, atomic layer deposition (ALD), physical vapor deposition (PVD), thermal oxidation, combinations thereof, and/or the like. The barrier layer may be formed from a nitride or an oxynitride, such as titanium nitride, titanium oxynitride, tantalum nitride, tantalum oxynitride, tungsten nitride, combinations thereof, and/or the like. A conductive material may be deposited over the thin barrier layer and in the openings. The conductive material may be formed by an electro-chemical plating process, CVD, ALD, PVD, combinations thereof, and/or the like. Examples of conductive materials are copper, tungsten, aluminum, silver, gold, combinations thereof, and/or the like. Excess conductive material and barrier layer is removed from the front surface of the substrate 102 by, for example, a chemical-mechanical polish (CMP). Thus, the vias 110 may include a conductive material, with a thin barrier layer between the conductive material and the substrate 102.

The interconnect structure 104 may then be formed over the substrate 102 and the vias 110 using processes and materials the same as or similar to the processes and materials used to form the interconnect structure 104 discussed above with reference to FIG. 3.

The backside of the substrate 102 may then be thinned and etched back to expose the vias 110. After the vias 110 are exposed, the vias 110 may be referred to as through vias, through-substrate vias or, in embodiments in which the substrate 102 is a silicon substrate, through-silicon vias (TSVs). In various embodiments, the surfaces of the vias 110 may be level with, or may protrude from surfaces of the substrate 102. The thinning process may be performed using an etching process and/or a planarization process, such as a CMP process. For example, a planarizing process, such as a CMP, may be performed to initially expose the vias 110. Thereafter, one or more wet etching processes having a high etch-rate selectivity between the material of the vias 110 and the substrate 102 may be performed, thereby leaving the vias 110 protruding from the backside of the substrate 102. In embodiments in which the substrate 102 comprises silicon, the etch process may be, for example, a dry etch process using HBr/O₂, HBr/Cl₂/O₂, SF₆/Cl₂, SF₆ plasma, or the like.

The backside dielectric layer 112 is formed over the backside of the substrate 102 and surrounding the vias 110. The backside dielectric layer 112 may be formed from silicon oxide, silicon nitride, silicon carbide, silicon oxynitride, a polymer, which may be a photo-sensitive material such as PBO, polyimide, or BCB, a low-K dielectric material such as PSG, BPSG, FSG, SiOxCy, SOG, spin-on polymers, silicon carbon material, compounds thereof, composites thereof, combinations thereof, or the like. The backside dielectric layer 112 may be deposited by any suitable method, such as spin coating, CVD, PECVD, HDP-CVD, or the like. After the backside dielectric layer 112 is deposited, surfaces of the vias 110 may be exposed through the backside dielectric layer 112 using a planarization process such as CMP.

Figure 6:
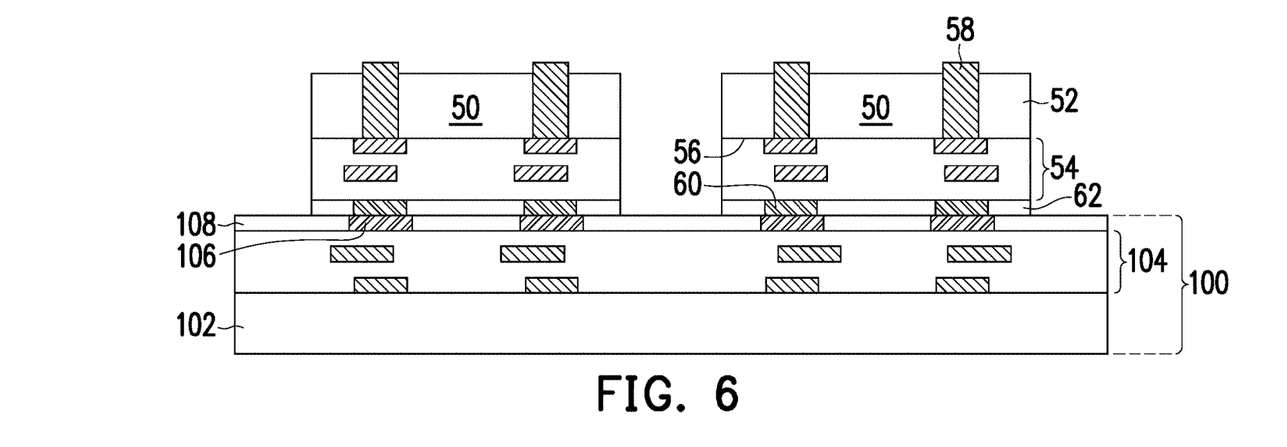
FIG. 6 illustrates a cross-sectional view of an etch-back of the first dies, in accordance with some embodiments.

FIG. 6 illustrates the F2F configuration of FIG. 4 after the first dies 50 are etched back to expose portions of the vias 58 protruding from the substrate 52. One or more wet etching processes having a high etch-rate selectivity between the material of the vias 58 and the substrate 52 may be performed, thereby leaving the vias 58 protruding from the backside of the substrate 52. In embodiments in which the substrate 52 comprises silicon, the etch process may be, for example, a dry etch process using HBr/O₂, HBr/Cl₂/O₂, SF₆/CL₂, SF₆ plasma, or the like. In some embodiments, the etch processes used to etch the substrate 52 may partially etch the dielectric bonding layer 108. In some embodiments, the substrate 52 may be etched such that the substrate 52 has a thickness of less than about 40 μm.

Figure 7:
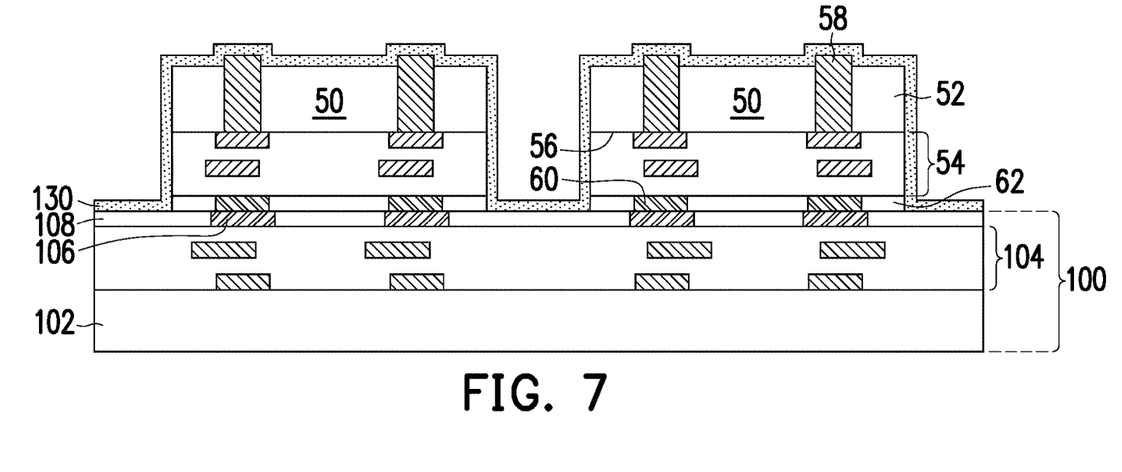
FIG. 7 illustrates a cross-sectional view of a formation of a first isolation bonding film, in accordance with some embodiments.

FIG. 7 illustrates the formation of a first isolation bonding film 130 over the structure of FIG. 6. The first isolation bonding film 130 may be formed using a conformal deposition process, such as CVD, ALD, or the like. In some embodiments, the first isolation bonding film 130 may be formed from silicon nitride, although other dielectric materials such as silicon oxide, silicon carbide, silicon nitride, silicon oxynitride, oxygen-doped silicon carbide, nitrogen-doped silicon carbide, a polymer, which may be a photo-sensitive material such as PBO, polyimide, or BCB, a low-K dielectric material such as PSG, BPSG, FSG, SiOxCy, SOG, spin-on polymers, silicon carbon material, compounds thereof, composites thereof, combinations thereof, or the like may also be used for the first isolation bonding film 130. The first isolation bonding film 130 may have a thickness from about 10 nm to about 2,000 nm, such as about 1,000 nm. The first isolation bonding film 130 may be formed of a material suitable for fusion bonding to dielectric bonding layers 62 of subsequently hybrid bonded dies (such as second dies 70, third dies 80, and fourth dies 90, illustrated in FIG. 9). The first isolation bonding film 130 may be formed to prevent or reduce diffusion of material (e.g., copper) from the bond pads 60 of the subsequently hybrid bonded dies into the substrates 52 of the first dies 50. The diffusion of the material from the bond pads 60 into the substrates 52 can negatively affect device performance and lead to device failures. As such, including the first isolation bonding film 130 improves device performance and reduces device defects.

Figure 8:
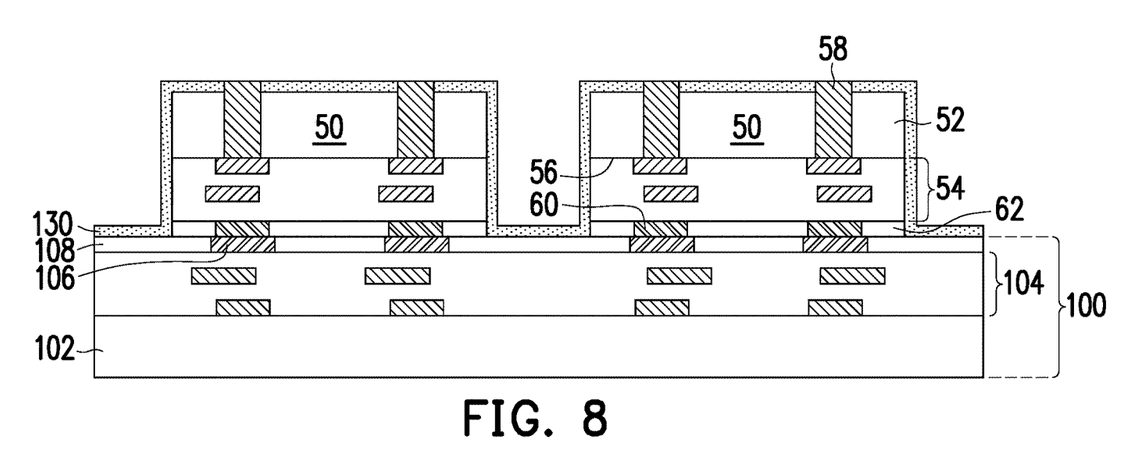
FIG. 8 illustrates a cross-sectional view of a planarization of the first isolation bonding film and vias, in accordance with some embodiments.

FIG. 8 illustrates a planarization of the first isolation bonding film 130. Following the deposition of the first isolation bonding film 130, the first isolation bonding film 130 may be planarized using a process such as CMP to expose surfaces of the vias 58. As illustrated in FIG. 8, following the planarization, surfaces of the first isolation bonding film 130 may be level with surfaces of the vias 58.

Figure 9:
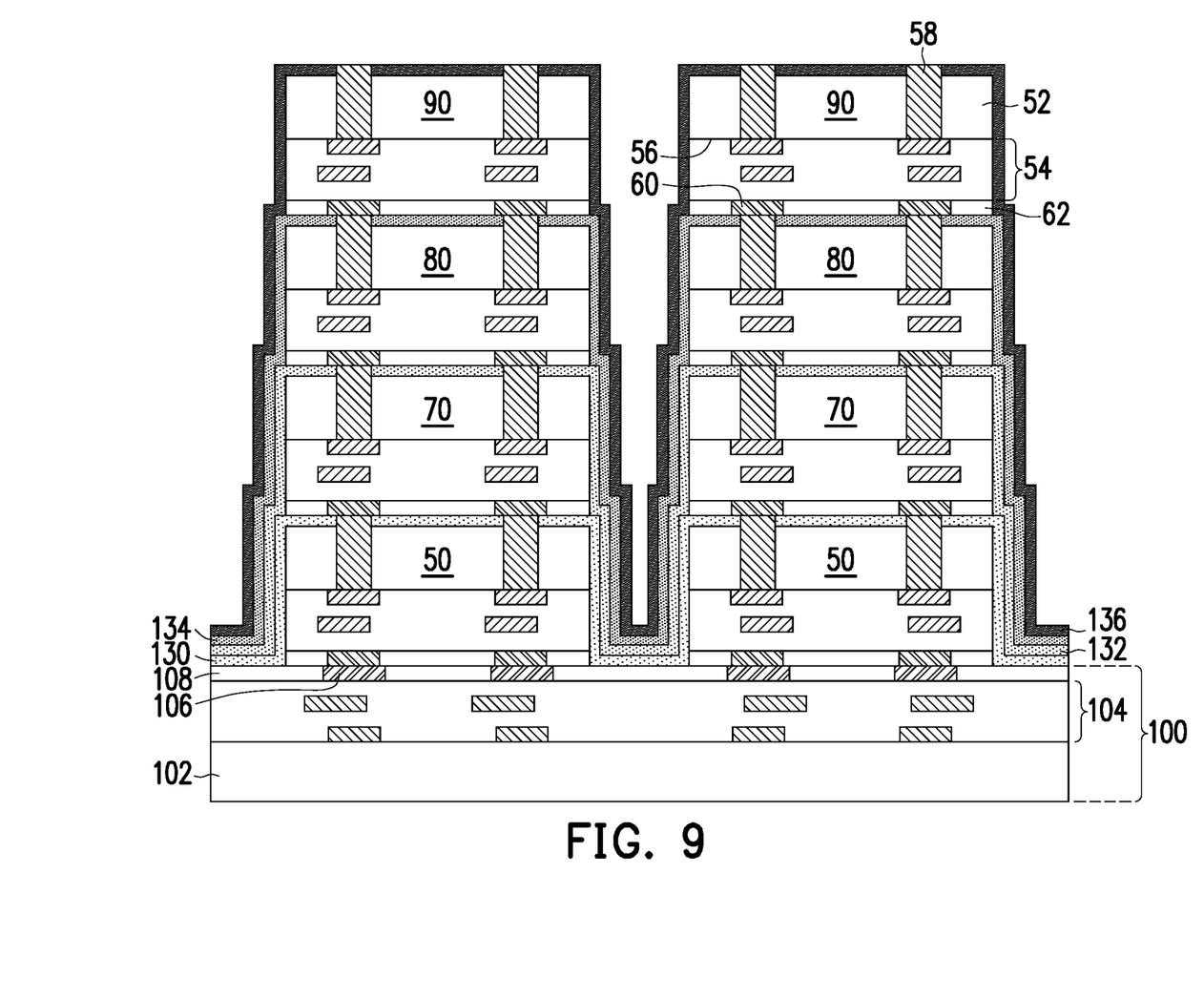
FIG. 9 illustrates a cross-sectional view of a formation of second dies, third dies, fourth dies, a second isolation bonding film, a third isolation bonding film, and a fourth isolation bonding film, in accordance with some embodiments.

In FIG. 9, the processes discussed with respect to FIGS. 4, 6, 7, and 8 are repeated in order to bond second dies 70 to the first dies 50, third dies 80 to the second dies 70, and fourth dies 90 to the third dies 80 and to form a second isolation bonding film 132, a third isolation bonding film 134, and a fourth isolation bonding film 136. The second dies 70, the third dies 80, and the fourth dies 90 may be the same as or similar to the first dies 50 and each of the second dies 70, the third dies 80, and the fourth dies 90 may be bonded through the same or similar processes as the first dies 50. The second isolation bonding film 132, the third isolation bonding film 134, and the fourth isolation bonding film 136 may be formed of the same materials and deposited by the same processes as the first isolation bonding films 130. As illustrated in FIG. 9, the second dies 70 are bonded to the vias 58 of the first dies 50 and the first isolation bonding film 130. The second isolation bonding film 132 extends along top surfaces and sidewalls of the first isolation bonding film 130 and the second dies 70. The third dies 80 are bonded to the vias 58 of the second dies 70 and the second isolation bonding film 132. The third isolation bonding film 134 extends along top surfaces and sidewalls of the second isolation bonding film 132 and the third dies 80. The fourth dies 90 are bonded to the vias 58 of the third dies 80 and the third isolation bonding film 134. The fourth isolation bonding film 136 extends along top surfaces and sidewalls of the third isolation bonding film 134 and the fourth dies 90.

After the second dies 70, the third dies 80, and the fourth dies 90 are bonded and the second isolation bonding film 132, the third isolation bonding film 134, and the fourth isolation bonding film 136 are formed, an anneal may be performed on the structure of FIG. 9. The anneal may be performed at a temperature from about 100° C. to about 400° C., below about 250° C., or about 150° C. The anneal may be performed for a time from about 30 minutes to about 3 hours, such as about 3 hours.

Figure 10:
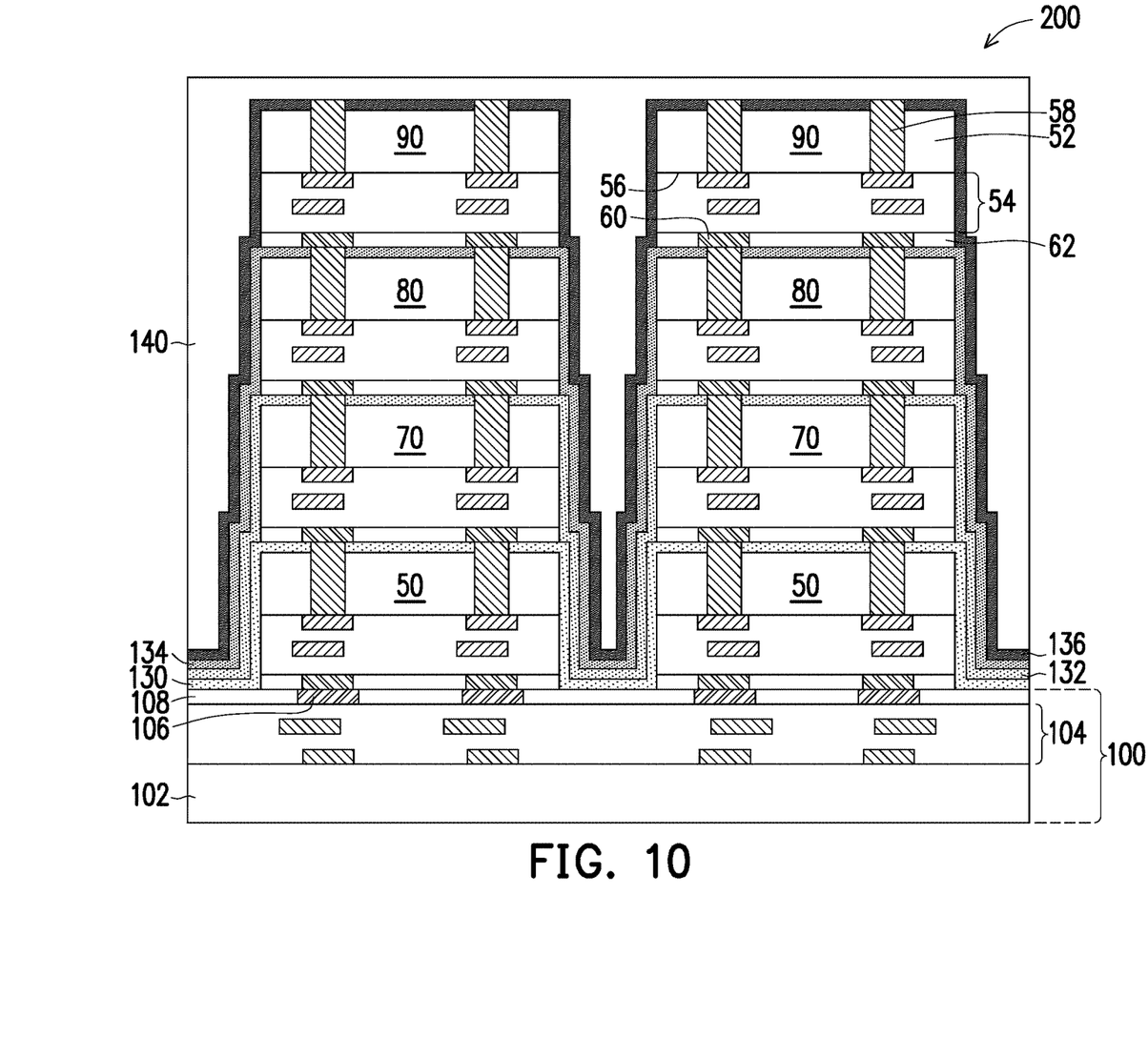
FIG. 10 illustrates a cross-sectional view of a formation of an encapsulant, in accordance with some embodiments.
Figure 11:
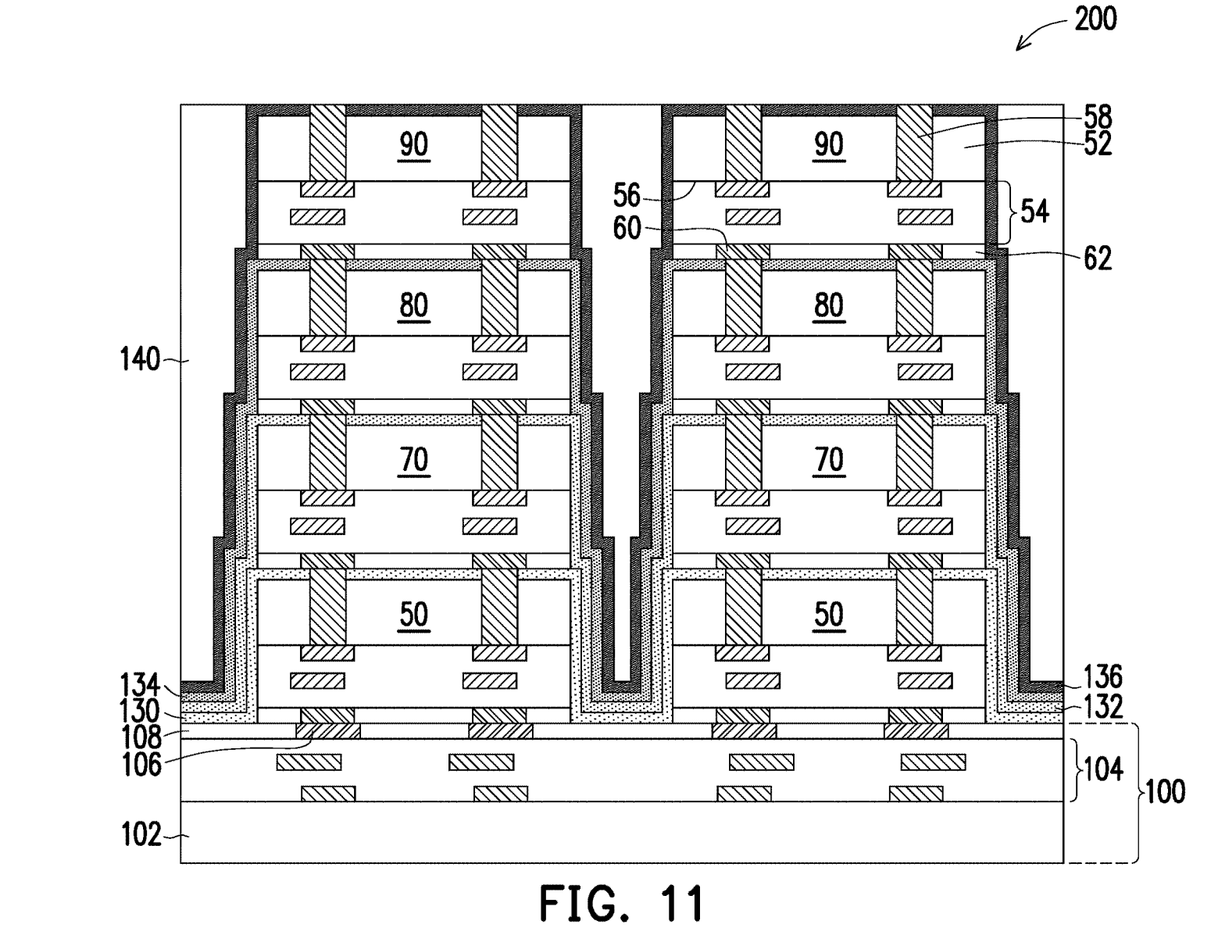
FIG. 11 illustrates a cross-sectional view of a planarization of the encapsulant, in accordance with some embodiments.

FIG. 10 illustrates an encapsulant 140 formed over the structure of FIG. 9 to form a completed chip-on-wafer (CoW) package 200 (hereinafter referred to as package 200). The encapsulant 140 may be a molding compound, a polymer material, a dielectric material, combinations thereof, or the like. In embodiments in which the encapsulant 140 is a dielectric material, the encapsulant 140 may comprise an oxide, such as silicon oxide, a nitride, such as silicon nitride, a combination thereof, such as silicon oxynitride, or the like. In these embodiments, the encapsulant 140 may be applied by CVD, spin coating, or the like. In embodiments in which the encapsulant 140 is a molding compound or a polymer material, the encapsulant 140 may comprise an epoxy, a resin, or a moldable polymer such as PBO, polyimide (PI), polyphenylene sulfide (PPS), polyether ether ketone (PEEK), polyethersulfone (PES), combinations of these, or the like. In these embodiments, the encapsulant 140 may be applied by compression molding, transfer molding, or the like. The encapsulant 140 may be applied in liquid or semi-liquid form and then subsequently cured. As illustrated in FIG. 11, after the encapsulant 140 is formed, the encapsulant 140 may be planarized to expose the vias 58 of the fourth dies 90. A process such as CMP may be used to planarize the encapsulant 140.

Forming the package 200 including the first isolation bonding film 130, the second isolation bonding film 132, the third isolation bonding film 134, and the fourth isolation bonding film 136 reduces or eliminates diffusion of material (e.g., copper) from the bond pads 60 into the substrates 52 of the first dies 50, the second dies 70, and the third dies 80. This improves device performance and reduces device defects. Moreover, thinning and singulating the first dies 50, the second dies 70, the third dies 80, and the fourth dies 90 without using a carrier substrate reduces contamination of the surfaces of the first dies 50, the second dies 70, the third dies 80, and the fourth dies 90, reducing device defects, and reduces the cost of forming the first dies 50, the second dies 70, the third dies 80, and the fourth dies 90.

Figure 12:
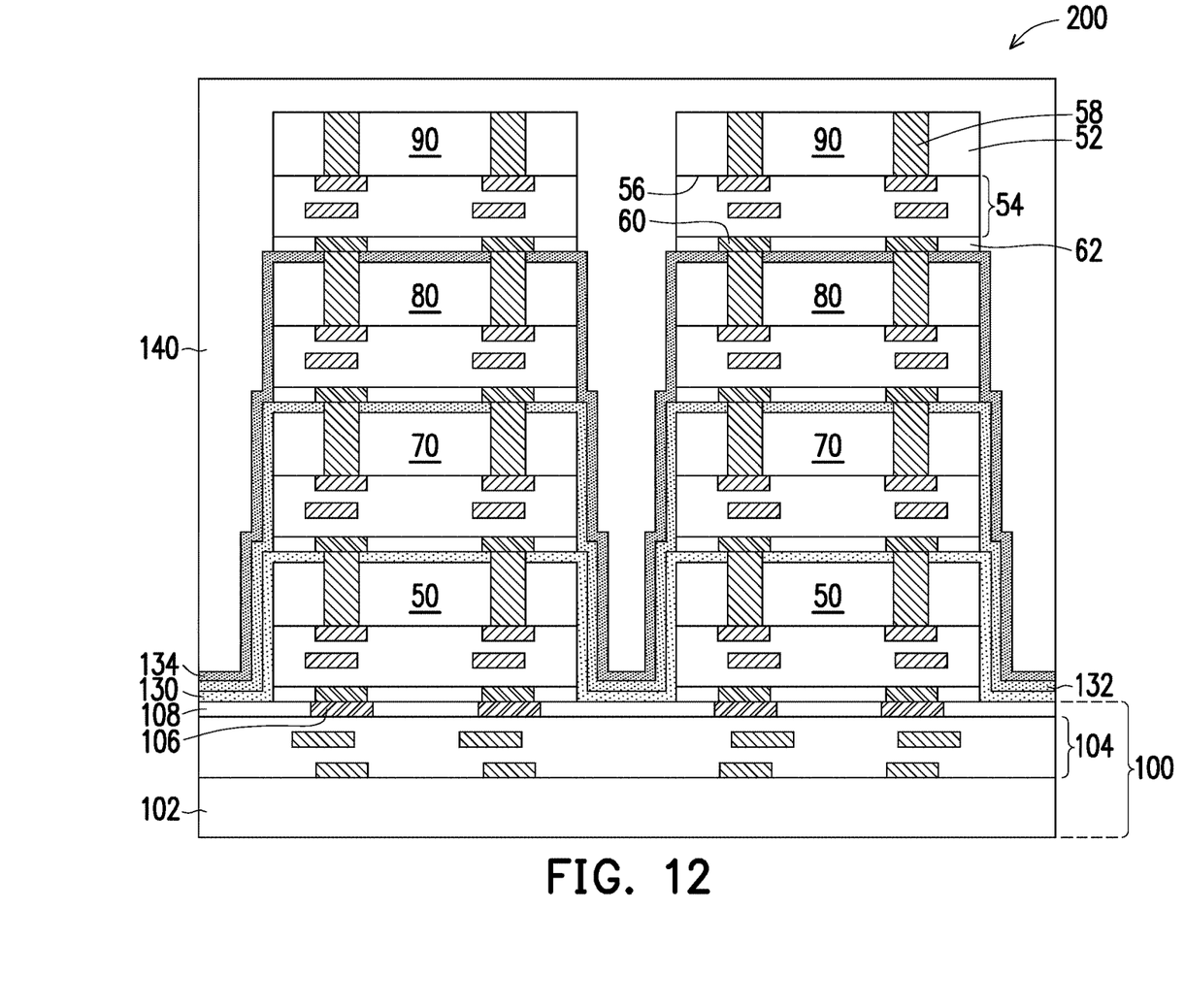
FIG. 12 illustrates a cross-sectional view of a packaged semiconductor device without a fourth isolation bonding film, in accordance with some embodiments.
Figure 13:
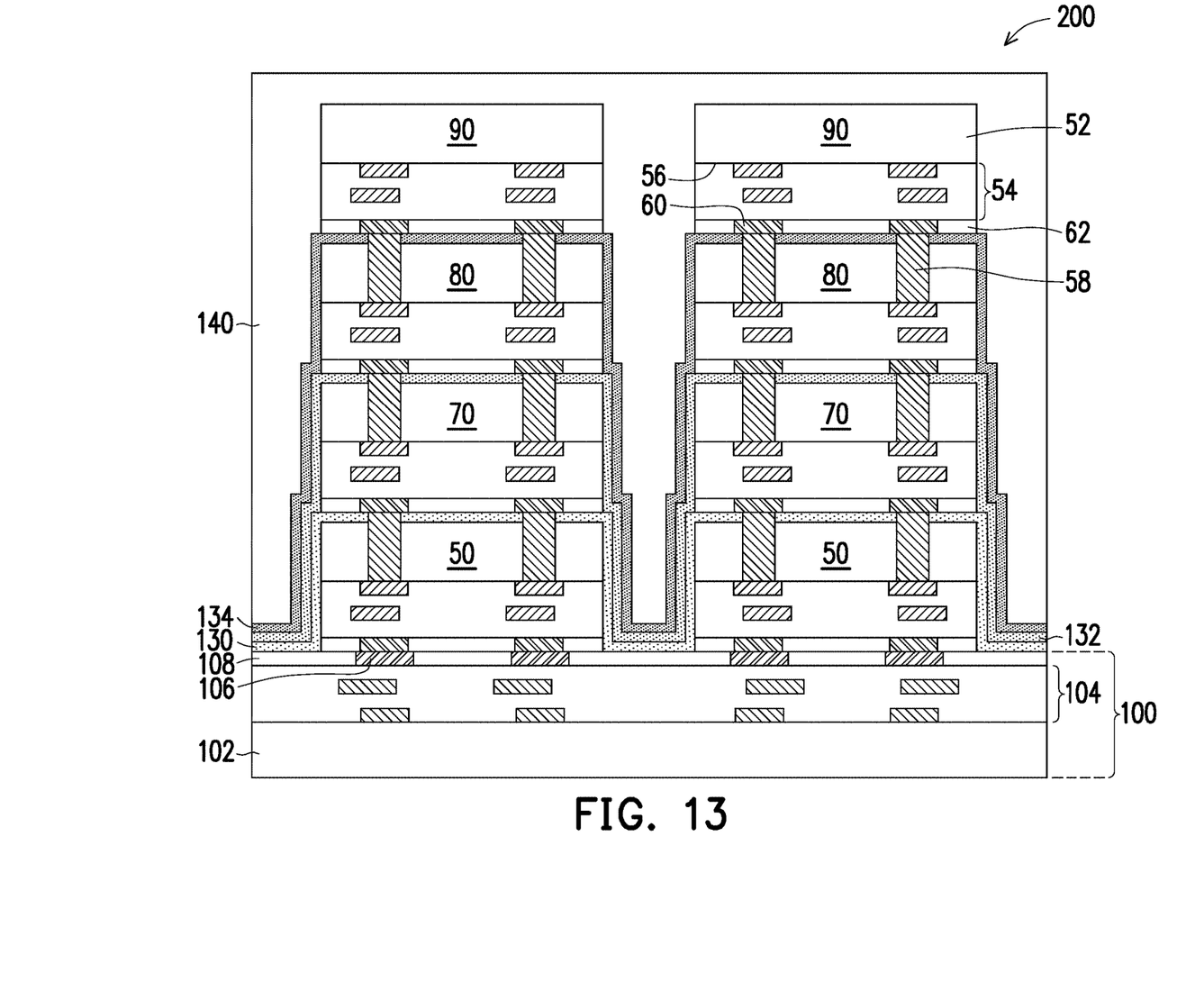
FIG. 13 illustrates a cross-sectional view of a packaged semiconductor device having fourth dies without vias and without a fourth isolation bonding film, in accordance with some embodiments.
Figure 14:
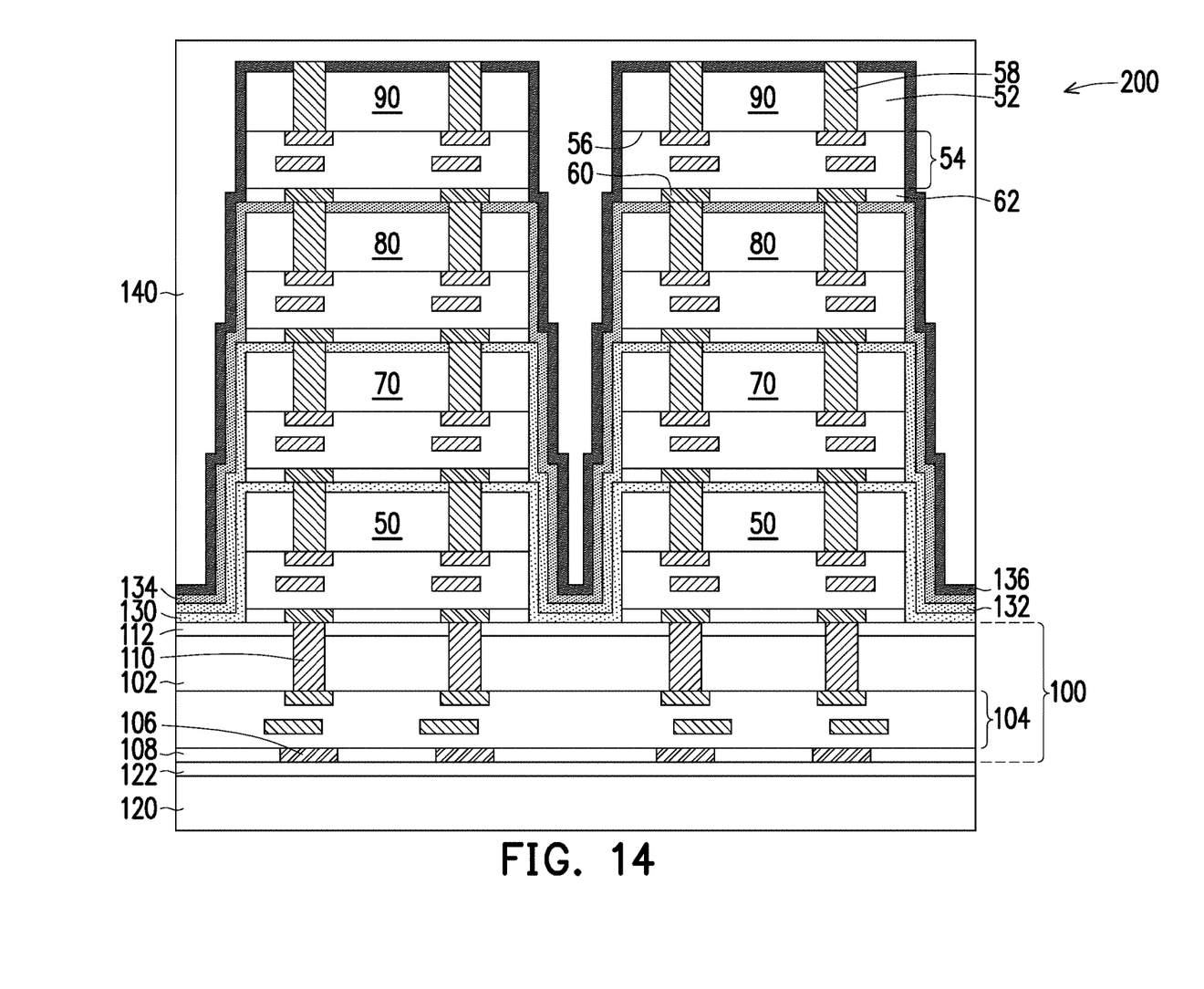
FIG. 14 illustrates a cross-sectional view of a packaged semiconductor device in which the first dies are bonded to the back surface of the package substrate, in accordance with some embodiments.

FIGS. 12-14 illustrate packages 200 according to various embodiments. In FIG. 12, the package 200 is formed without a fourth isolation bonding film 136 being formed over the fourth dies 90. Because additional dies are not bonded to the fourth dies 90, a concern of material (e.g., copper) diffusing from the additional dies into the substrates 52 of the fourth dies 90 is reduced. As such, the fourth isolation bonding film 136 may not be formed to save time and cost. As illustrated in FIG. 12, in embodiments in which an electrical connection will not be made to the fourth dies 90, the encapsulant 140 may be formed to cover any exposed vias 58.

In FIG. 13, the fourth dies 90 are formed without the vias 58. In embodiments in which no electrical connection is desired to the fourth dies 90 or other uppermost dies, the processing required to form the vias 58 may be omitted to save cost. The packages 200 illustrated in FIGS. 12 and 13 still obtain the benefits of the first isolation bonding film 130, the second isolation bonding film 132, and the third isolation bonding film 134, including improved device performance and reduced device defects, as well as the benefits of thinning the first dies 50, the second dies 70, the third dies 80, and the fourth dies 90 without using a carrier substrate, including reduced cost and reduced device defects.

FIG. 14 illustrates a package 200 in which the first dies 50 are bonded to the package substrate 100 in the F2B configuration of FIG. 5. As illustrated in FIG. 14, the package 200 includes the second dies 70, the third dies 80, the fourth dies 90, the first isolation bonding film 130, the second isolation bonding film 132, the third isolation bonding film 134, the fourth isolation bonding film 136, and the encapsulant 140. In this embodiment, the carrier substrate 120 and the release layer may be removed from the front surface of the substrate 102 such that the package substrate 100 can be bonded to additional packages or devices, such as a substrate to form a Chip-on-Wafer-on-Substrate (CoWoS) or the like. The package 200 has improved device performance and reduced device defects due to the inclusion of the first isolation bonding film 130, the second isolation bonding film 132, the third isolation bonding film 134, and the fourth isolation bonding film 136. The package 200 further has reduced cost and reduced device defects due to thinning and singulating the first dies 50, the second dies 70, the third dies 80, and the fourth dies 90 without using a carrier substrate. Other configurations are possible. For example, any of the embodiments illustrated in FIGS. 10-13 may be used in a F2B configuration with the package substrate 100.

In accordance with an embodiment, a semiconductor device includes a first die bonded to a package substrate, the first die including vias extending through a substrate, the vias extending above a top surface of the substrate; a first dielectric film extending along a top surface of the package substrate, along the top surface of the substrate, and along sidewalls of the first die, the vias extending through the first dielectric film; a second die bonded to the first dielectric film and the vias; and an encapsulant over the package substrate, the first die, the first dielectric film, and the second die. In an embodiment, the first dielectric film includes silicon nitride. In an embodiment, the substrate includes a silicon substrate, and the first dielectric film is interposed between the silicon substrate and the second die. In an embodiment, the second die includes bond pads in a second dielectric film, the first dielectric film and the vias being hybrid bonded to the second dielectric film and the bond pads. In an embodiment, the semiconductor device further includes a third dielectric film extending along a top surface and sidewalls of the first dielectric film and along a top surface and sidewalls of the second die, the third dielectric film and the first dielectric film including a first dielectric material. In an embodiment, the encapsulant is in contact with the third dielectric film. In an embodiment, the encapsulant is in contact with a top surface and sidewalls of the second die and the encapsulant is in contact with the first dielectric film.

In accordance with another embodiment, a method includes bonding a first die to a package substrate, the first die including first vias disposed in a first substrate of the first die; after bonding the first die to the package substrate, etching a backside of the first die such that top surfaces of the first vias extend above top surfaces of the first substrate; depositing a first dielectric film over the package substrate and the first die, the first dielectric film extending along sidewalls and the top surfaces of the first vias; planarizing the first dielectric film to expose the top surfaces of the first vias; and bonding a second die to the first die, the second die being bonded to the first dielectric film and the first vias. In an embodiment, the first dielectric film is deposited along a top surface of the package substrate and along sidewalls and the top surfaces of the first substrate. In an embodiment, the method further includes thinning the first substrate of the first die to expose the first vias before bonding the first die to the package substrate. In an embodiment, the second die includes second vias disposed in a second substrate of the second die, the method further including etching the backside of the second die such that top surfaces of the second vias extend above top surfaces of the second substrate; and depositing a second dielectric film over the second die and the first dielectric film, the second dielectric film surrounding sidewalls and the top surfaces of the second vias. In an embodiment, the method further includes forming an encapsulant over the package substrate, the first die, and the second die, the encapsulant contacting the second dielectric film. In an embodiment, the method further includes planarizing the encapsulant such that top surfaces of the encapsulant are level with top surfaces of the second vias and top surfaces of the second dielectric film. In an embodiment, the first dielectric film is deposited by chemical vapor deposition (CVD) or atomic layer deposition (ALD).

In accordance with yet another embodiment, a semiconductor package includes a substrate including a first surface and a second surface opposite the first surface; a first die including a first interconnect structure at a front surface thereof and a first substrate at a back surface thereof, the first die including a first via extending through the first substrate, the front surface of the first die being bonded to the first surface of the substrate; a first dielectric layer extending along the first surface of the substrate and along the back surface and sidewalls of the first die, wherein a top surface of the first dielectric layer is level with top surfaces of the first via extending through the first substrate; and an encapsulant over the first dielectric layer, the first die, and the substrate. In an embodiment, the substrate includes a second interconnect structure disposed at the first surface thereof and a second substrate disposed at the second surface thereof, the second interconnect structure being bonded to the first interconnect structure. In an embodiment, the substrate includes second vias extending through a second substrate to the first surface, the second vias being surrounded by a second dielectric layer at the first surface, the first die being bonded to the second vias and the second dielectric layer. In an embodiment, the first dielectric layer includes silicon nitride. In an embodiment, the semiconductor package further includes a second die, the second die including a second interconnect structure at a front surface thereof and a second substrate at a back surface thereof, the front surface of the second die being hybrid bonded to the back surface of the first die. In an embodiment, the semiconductor package further includes a second dielectric layer extending along a top surface of the first dielectric layer and along the back surface and sidewalls of the second die, the encapsulant contacting the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first die bonded to a package substrate;
   a first dielectric film over a top surface of the package substrate, over a top surface of the first die, and along sidewalls of the first die;
   a second die bonded to the first dielectric film and electrically coupled to the first die; and
   an encapsulant over the package substrate, the first die, the first dielectric film, and the second die, wherein the encapsulant extends closer to the package substrate than the top surface of the first die.

2. The semiconductor device of claim 1, further comprising a second dielectric film over the first dielectric film and a top surface of the second die, wherein the second dielectric film is between the encapsulant and the second die.

3. The semiconductor device of claim 2, wherein the first dielectric film and the second dielectric film comprise silicon nitride.

4. The semiconductor device of claim 2, wherein the second dielectric film contacts a sidewall of the first dielectric film and a sidewall of the second die.

5. The semiconductor device of claim 1, further comprising:
   an uppermost dielectric film over the second die; and
   an uppermost die over the uppermost dielectric film, the uppermost die being electrically coupled to the second die, wherein the encapsulant contacts a sidewall of the uppermost die.

6. The semiconductor device of claim 5, wherein the encapsulant contacts sidewalls of the uppermost die.

7. The semiconductor device of claim 5, wherein the encapsulant contacts an upper surface of the uppermost die.

8. A semiconductor package comprising:
   a package substrate comprising a first surface and a second surface opposite the first surface;
   a first die on a first surface of the package substrate, the first die comprising a first substrate, a first interconnect structure on the first substrate, and a first via extending through the first substrate;
   a first dielectric layer on the first surface of the package substrate and along a surface and sidewalls of the first substrate, wherein the first via extends through the first dielectric layer; and
   an encapsulant over the first dielectric layer, the first die, and the package substrate.

9. The semiconductor package of claim 8, wherein a thickness of the first dielectric layer is less than a thickness of the first die.

10. The semiconductor package of claim 8, further comprising a second die directly bonded to the first via and the first dielectric layer, wherein the first dielectric layer is between the first die and the second die.

11. The semiconductor package of claim 10, further comprising a second dielectric layer over the first dielectric layer, wherein the second dielectric layer is between the first dielectric layer and the encapsulant.

12. The semiconductor package of claim 11, wherein the second dielectric layer extends over an upper surface of the second die.

13. The semiconductor package of claim 12, wherein a combined thickness of the first dielectric layer and the second dielectric layer is less than a thickness of the first die.

14. The semiconductor package of claim 11, further comprising an uppermost die over the second die, wherein the encapsulant contacts a sidewall of the uppermost die.

15. A semiconductor package comprising:
   a first die bonded to a package substrate, the first die comprising a first substrate and a first through via extending through the first substrate, wherein the first through via extends through the first substrate;
   a first dielectric film over the package substrate and the first die, the first dielectric film contacting sidewalls of the first substrate and sidewalls of the first through via; and
   a second die bonded to the first dielectric film and the first through via, wherein the first dielectric film is between the first die and the second die.

16. The semiconductor package of claim 15, further comprising an encapsulant over the package substrate and along sidewalls of the first die and the second die.

17. The semiconductor package of claim 16, further comprising:
   a second dielectric film over the first dielectric and an upper surface of the second die, wherein the second dielectric film is between the encapsulant and the second die; and
   an uppermost die over the second die.

18. The semiconductor package of claim 17, wherein the encapsulant extends over an upper surface of the uppermost die.

19. The semiconductor package of claim 17, wherein the encapsulant contacts a sidewall of the uppermost die.

20. The semiconductor package of claim 17, further comprising a third dielectric layer contacting sidewalls of the uppermost die, wherein the third dielectric layer is between the encapsulant and the third dielectric layer.

* * * * *